United States Patent
Wu et al.

(10) Patent No.: US 9,070,802 B2
(45) Date of Patent: Jun. 30, 2015

(54) IMAGE SENSOR AND FABRICATING METHOD OF IMAGE SENSOR

(71) Applicant: Himax Imaging, Inc., Grand Cayman (KY)

(72) Inventors: Yang Wu, Grand Cayman (KY); Feixia Yu, Grand Cayman (KY); Inna Patrick, Grand Cayman (KY); Yu Hin Desmond Cheung, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 0 days.

(21) Appl. No.: 14/207,470

(22) Filed: Mar. 12, 2014

(65) Prior Publication Data

US 2015/0048466 A1 Feb. 19, 2015

Related U.S. Application Data

(60) Provisional application No. 61/866,550, filed on Aug. 16, 2013.

(51) Int. Cl.
*H01L 27/146* (2006.01)
*H01L 31/113* (2006.01)
*H01L 31/18* (2006.01)
*H01L 31/0352* (2006.01)

(52) U.S. Cl.
CPC ............ *H01L 31/0352* (2013.01); *H01L 31/18* (2013.01); *H01L 27/14654* (2013.01); *H01L 27/14689* (2013.01); *H01L 31/1136* (2013.01)

(58) Field of Classification Search
CPC ................................................ H01L 27/14656
See application file for complete search history.

(56) References Cited

U.S. PATENT DOCUMENTS

| | | | | |
|---|---|---|---|---|
| 8,436,406 | B2 * | 5/2013 | Shinohara et al. | 257/291 |
| 2003/0085399 | A1 * | 5/2003 | Inagaki | 257/53 |
| 2006/0255372 | A1 * | 11/2006 | Patrick et al. | 257/225 |
| 2007/0018264 | A1 * | 1/2007 | Rhodes et al. | 257/432 |
| 2007/0045668 | A1 * | 3/2007 | Brady et al. | 257/219 |
| 2008/0135896 | A1 * | 6/2008 | Fan et al. | 257/292 |
| 2014/0247380 | A1 * | 9/2014 | Hynecek | 348/299 |

OTHER PUBLICATIONS

B. J. Hosticka et al., "CMOS Imaging for Automotive Applications", IEEE transactions on Electron Devices, vol. 50, No. 1 Jan. 2003.
Yasuo Ishihara, et al., "Interline CCD Image Sensor with an Antiblooming Structure", IEEE Transactions on Electron Devices, vol. ED-31, No. 1, Jan. 1984.
G. Agranov, et al., "Super Small, Sub 2μm Pixels for Novel CMOS Image Sensors", International Image Sensor Workshop, Jun. 7-10, 2007, Ogunquit, Maine USA.
K. Itonaga, et al., "Extremely-Low-Noise CMOS Image Sensor with High Saturation Capacity". 2011 IEDM.

* cited by examiner

*Primary Examiner* — Stephen W Smoot
(74) *Attorney, Agent, or Firm* — Winston Hsu; Scott Margo (57) ABSTRACT

The present invention provides an image sensor and a fabricating method of the image sensor. The image sensor comprises: a first type epitaxial layer, a photodiode region, a first type well region, a gate region of a source follower transistor, and a first type implant isolation region. The first type well region is formed within the first type epitaxial layer with a first horizontal distance to the photodiode region and a vertical distance to a surface of the first type epitaxial layer. The gate region of a source follower transistor is formed on the surface of the first type epitaxial layer and above the first type well region, and has a second horizontal distance to the photodiode region. There is a distance between the first type implant isolation region and the first type well region as an anti-blooming path.

8 Claims, 8 Drawing Sheets

IMAGE SENSOR AND FABRICATING METHOD OF IMAGE SENSOR

CROSS REFERENCE TO RELATED APPLICATIONS

This application claims the benefit of U.S. Provisional Application No. 61/866,550, filed on Aug. 16, 2013 and included herein by reference.

BACKGROUND OF THE INVENTION

1. Field of the Invention

The present invention relates to an image sensor and a fabricating method of the image sensor, and more particularly, to an image sensor and a fabricating method of the image sensor capable of reducing blooming by forming an anti-blooming path between the source follower transistor channel and the photodiode region.

2. Description of the Prior Art

CMOS image sensor (CIS) has been widely adopted in many applications, such as cell phone, webcam, security, toy, medical device, etc. The next big wave of CIS is on the automotive application. It can be used as driver's visual and action assistants for a safe and less stressful driving experience.

However, the requirements to an automobile image sensor are very demanding. They are mostly based on the harsh operation conditions of the automobiles. A key requirement of automotive sensors is low blooming.

Blooming happens when a pixel is filled up with photo carriers (in most cases, electrons) and the integration time is not reached yet. The incoming light still generates more electron/hole pairs but that can not be collected by this pixel anymore. The electrons and holes will be injected into grounded P-well and recombined over there. However, just like the principle of BJT, if there is an "empty" photodiode (PD) nearby as the "collector", and if electrons can not be fully recombined in such a short distance, they will flow into the empty PD by diffusion. One bright pixel, in this fashion, spreads to several other pixels in the neighboring region. Blooming is highly undesirable in CIS applications, especially automotive and surveillance ones.

The road scene, especially at night, is usually high dynamic range type. The CIS is required to have a good blooming control at ultra-bright region in order to ensure the neighboring dimly lit regions not washed out by the blooming charges. Otherwise, many details must be buried and it is hard for the car control system or the driver to extract the information from the scene. Another reason for low blooming is the request of some High Dynamic Range (HDR) scheme, in which the PDs integration times are different. The blooming of a longer integration PD could destroy the information in the shorter integration one. One more reason is cluster control. Even in the dark and especially at high temperature operation such as in a car, a super "hot" pixel could be filled up by strong dark current and reach blooming level. The adjacent hot pixels display a strange pattern as a hot cluster that is very hard to be corrected by ISP.

There are several prior arts about reducing blooming. In a prior art (Yasuo Ishihara, et al., "Interline CCD Image Sensor with an Antiblooming Structure", IEEE Transactions on Electron Devices, Vol., ED-31, NO. 1, January 1984), the CCD solution can provide high voltage for solid control of veridical drain "on" an "off" but such a large range of voltage is not available for the CIS.

In another prior art (G. Agranov, et al., "Super Small, Sub 2 μm Pixels For Novel CMOS Image Sensors", INTERNATIONAL IMAGE SENSOR WORKSHOP, Jun. 7-10, 2007, Ogunquit, Me. USA), the buried N-well design faces trade-off between anti-blooming and red response.

The other conventional solution is using surface anti-blooming drain. In CIS 4T pixel, the transfer gate (Tx) is slightly turned on during integration of the pixel, so blooming charge can be drained to the floating diffusion (FD) region. However, this solution has disadvantages of high leakage current from the Tx channel to the PD region, and increasing dark current and white pixels dramatically, and FWC is also a trade-off in this scheme. To overcome the dark current issue, a dedicated anti-blooming drain can be designed but it will reduce the photo sensing area.

Figure 1:
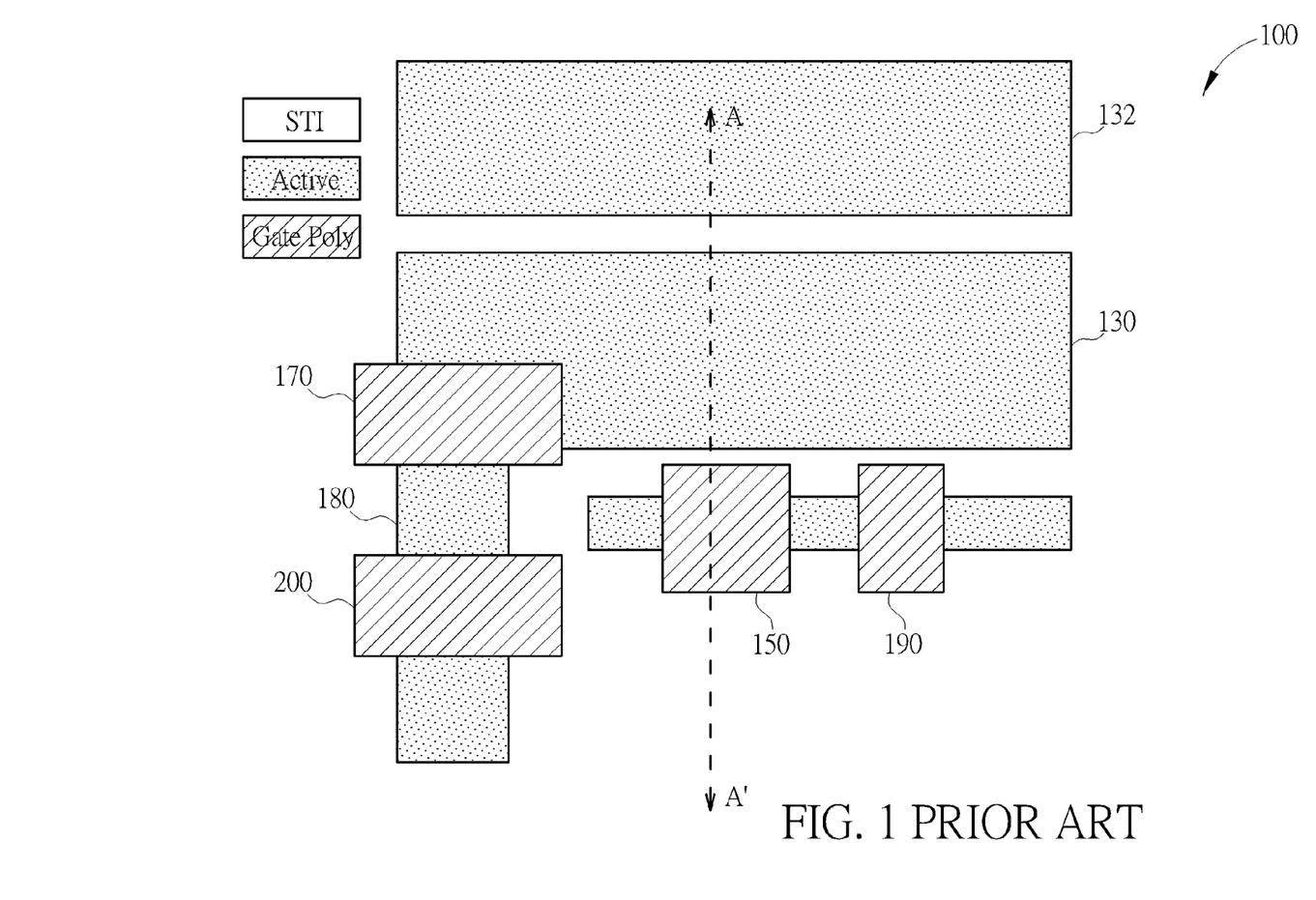
FIG. 1 shows a simplified top-view diagram of a conventional image sensor.
Figure 2:
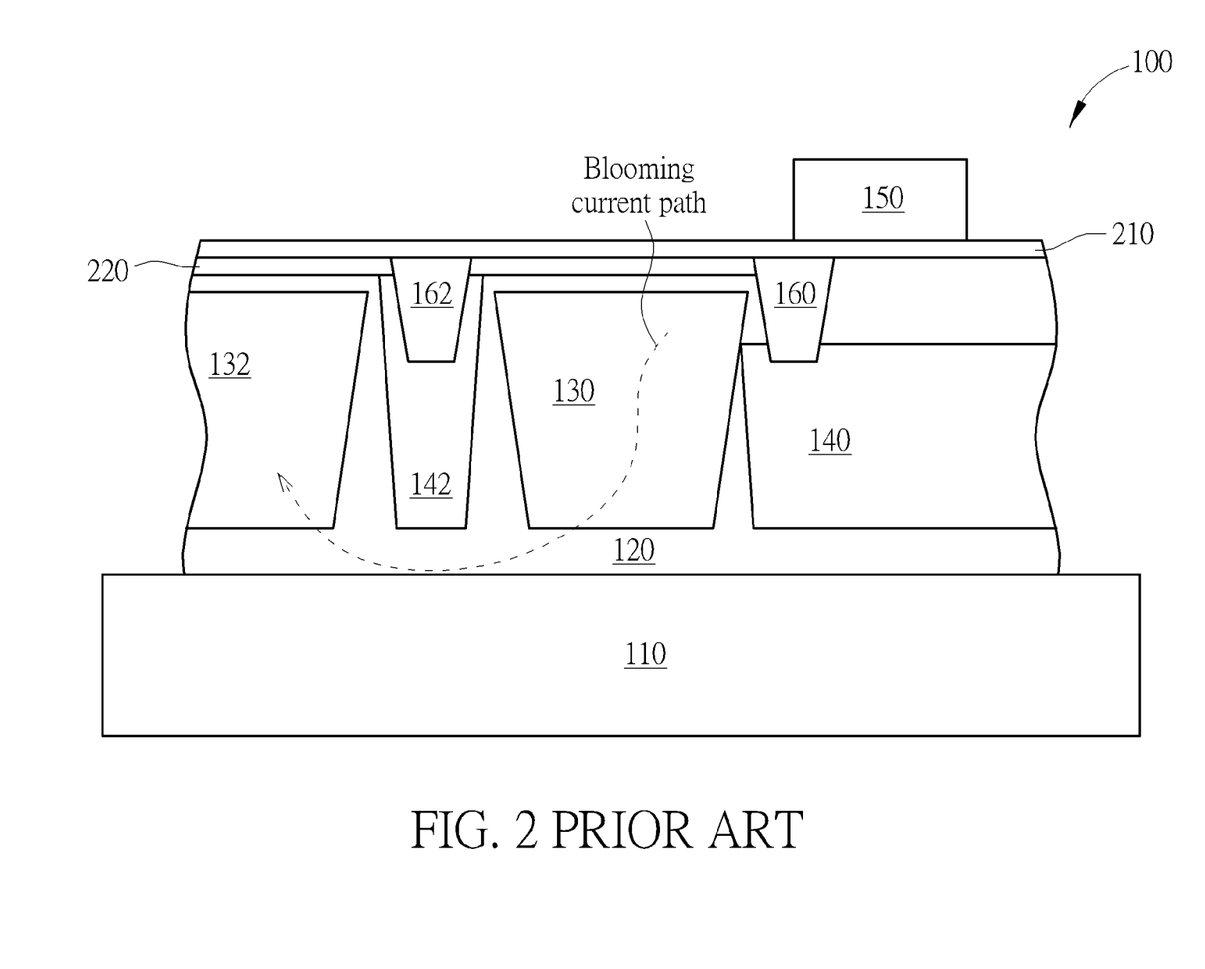
FIG. 2 shows a simplified cross-sectional view diagram of the conventional image sensor in FIG. 1.
Figure 3:
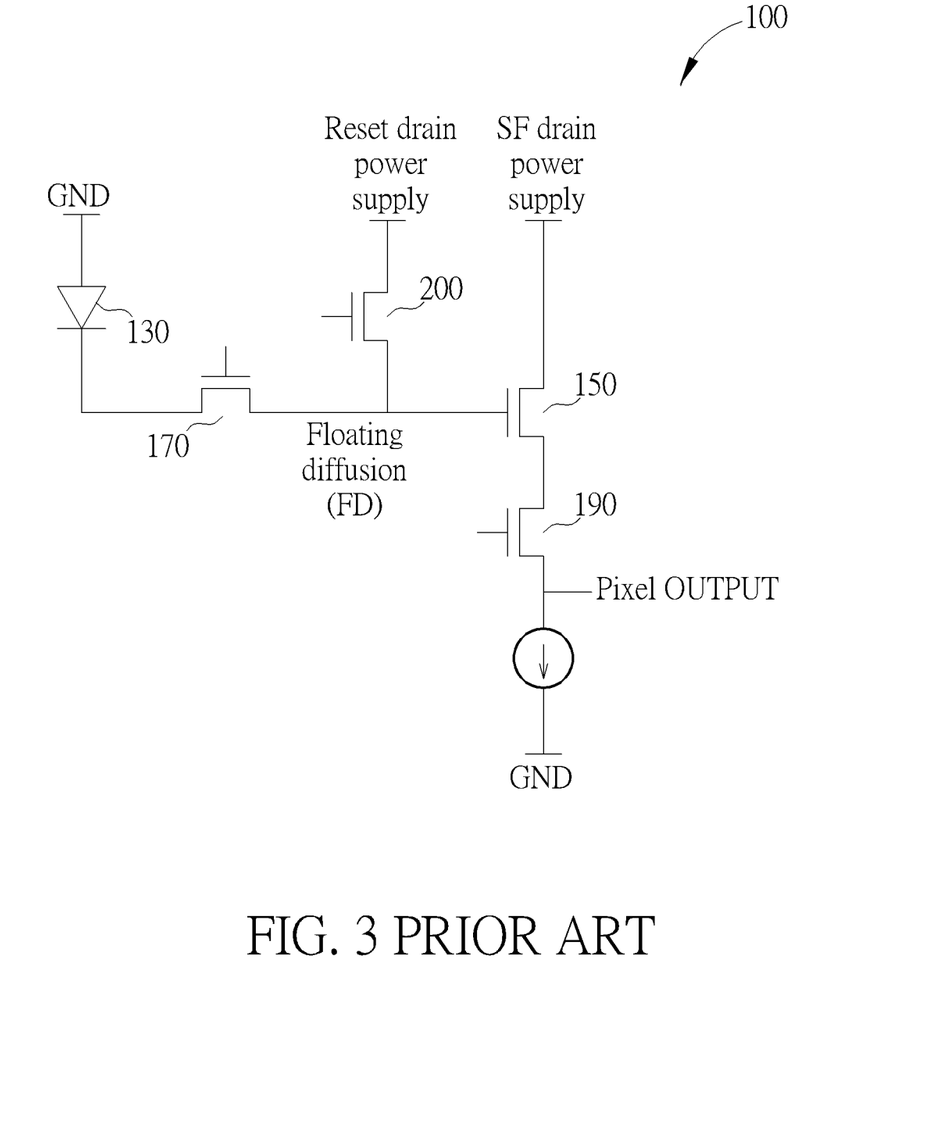
FIG. 3 shows an equivalent circuit diagram of the conventional image sensor in FIG. 1.
Figure 4:
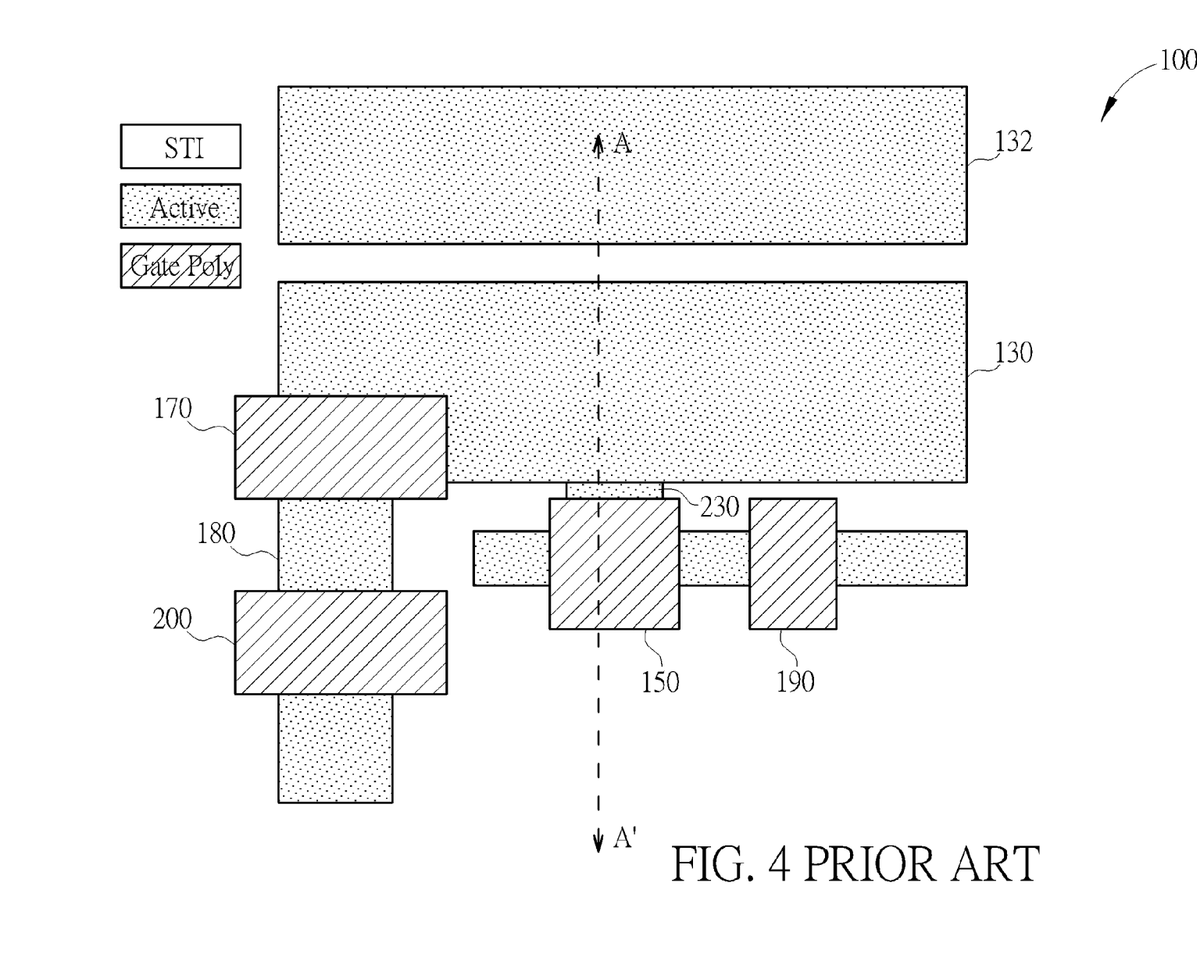
FIG. 4 shows a simplified top-view diagram of another conventional image sensor.
Figure 5:
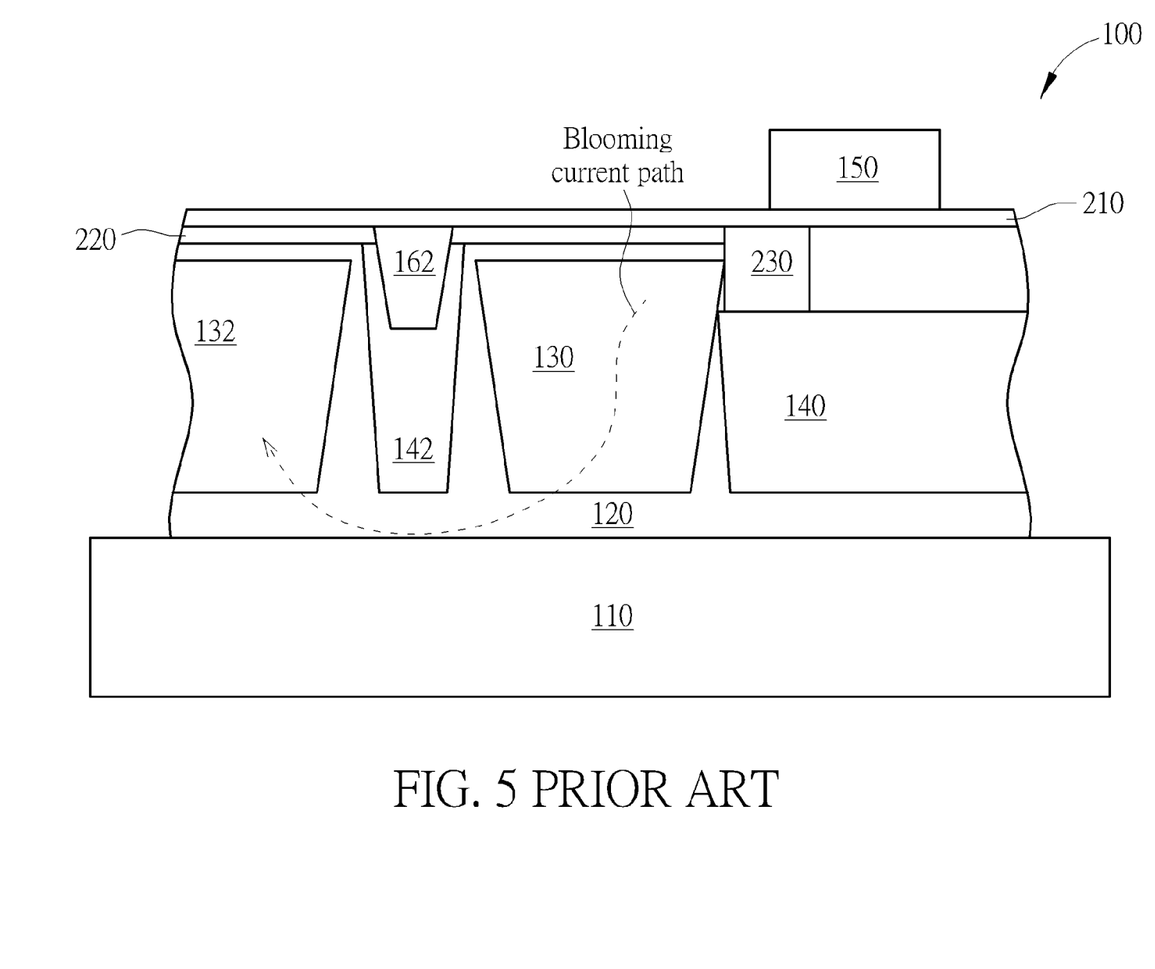
FIG. 5 shows a simplified cross-sectional view diagram of the conventional image sensor in FIG. 4.

For example, please refer to FIG. 1, FIG. 2, and FIG. 3. FIG. 1 shows a simplified top-view diagram of a conventional image sensor 100. FIG. 2 shows a simplified cross-sectional view (A-A') diagram of the image sensor 100. FIG. 3 shows an equivalent circuit diagram of the conventional image sensor 100. As shown in FIG. 1, FIG. 2, and FIG. 3, the image sensor 100 comprises: a P type substrate 110, a P type epitaxial layer 120, two photodiode regions 130, 132, two P type well regions 140, 142, a gate region 150 of a source follower (SF) transistor, two STI regions 160, 162, a transfer gate (Tx) 170, a floating diffusion (FD) region 180, a select gate (SEL) 190, a reset gate (RES) 200, a MOS gate oxide 210, and a surface pinning layer 220 of the photodiode regions 130, 132. The MOS gate oxide 210 is included in any CMOS process without exception, and Its stage is almost right before the poly gate formation. The surface pinning layer 220 is not a default CMOS process but necessary for the CIS pixel, and its stage is right after the poly gate formation. Forming surface pinning layer 220 is a standard process step to form the photodiode regions 130, 132. In addition, in another prior, the STI region 160 is replaced by a strong P-well isolation 230, as shown in FIG. 4 and FIG. 5.

SUMMARY OF THE INVENTION

It is therefore one of the objectives of the present invention to provide an image sensor and a fabricating method of the image sensor capable of reducing blooming by forming an anti-blooming path between the source follower transistor channel and the photodiode region, so as to solve the above problem because normally the SF drain is connected to the most positive power supply available on chip, so it acts as a very effective drain of blooming current injected into SF channel.

According to an embodiment of the present invention, an image sensor is disclosed. The image sensor comprises: a first type epitaxial layer, a photodiode region, a first type well region, a gate region of a source follower transistor, and a first type implant isolation region. The first type epitaxial layer is formed on a first type substrate. The photodiode region is formed within the first type epitaxial layer. The first type well region is formed within the first type epitaxial layer with a first horizontal distance to the photodiode region and a vertical distance to a surface of the first type epitaxial layer. The gate region of a source follower transistor is formed on the surface of the first type epitaxial layer and above the first type well region, and has a second horizontal distance to the photodiode region. The first type implant isolation region is formed within the first type epitaxial layer and between the first type well region and the photodiode region. There is a distance between the first type implant isolation region and the first type well region as an anti-blooming path.

According to an embodiment of the present invention, a fabricating method of an image sensor is disclosed. The fabricating method comprises: forming a first type epitaxial layer on a first type substrate; forming a photodiode region within the first type epitaxial layer; forming a first type well region within the first type epitaxial layer with a first horizontal distance to the photodiode region and a vertical distance to a surface of the first type epitaxial layer; forming a gate region of a source follower transistor on the surface of the first type epitaxial layer and above the first type well region, and having a second horizontal distance to the photodiode region; and forming a first type implant isolation region within the first type epitaxial layer and between the first type well region and the photodiode region; wherein there is a distance between the first type implant isolation region and the first type well region as an anti-blooming path.

Briefly summarized, the image sensor and the fabricating method of the image sensor of the present invention are capable of reducing blooming by forming an anti-blooming path between the source follower transistor channel and the photodiode region and with no STI between the source follower transistor channel and the photodiode region. By proper tuning of anti-blooming path potential barrier, almost all the electron leakage current generated from SF channel depletion region will be absorbed by SF drain terminal. Thus, the present invention can solve the above problem of using the Tx gate as the anti-blooming drain.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, hardware manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ".

Figure 6:
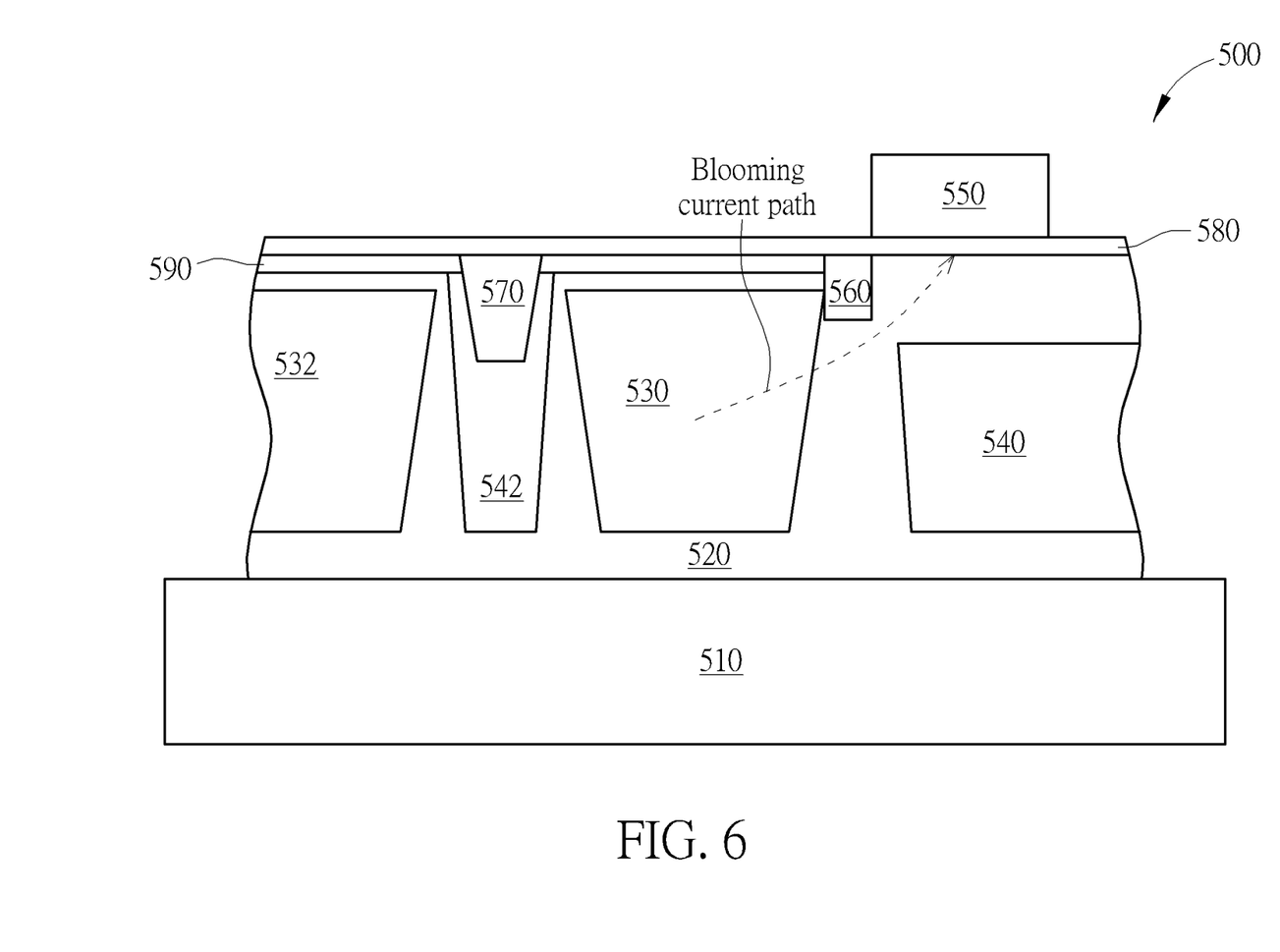
FIG. 6 shows a simplified cross-sectional view diagram of an image sensor 500 according to an embodiment of the present invention.

Please refer to FIG. 6. FIG. 6 shows a simplified cross-sectional view diagram of an image sensor 500 according to an embodiment of the present invention. As shown in FIG. 6, the image sensor 500 comprises: a P type substrate 510, a P type epitaxial layer 520, two photodiode regions 530, 532, two P type well regions 540, 542, a gate region 550 of a source follower transistor, a P type implant isolation region 560, a STI 570 region, a MOS gate oxide 580, and a surface pinning layer 590 of the photodiode regions 530, 532. The MOS gate oxide 580 is included in any CMOS process without exception, and it's stage is almost right before the poly gate formation. The surface pinning layer 590 is not a default CMOS process but necessary for the CIS pixel, and its stage is right after the poly gate formation. Forming surface pinning layer 590 is a standard process step to form the photodiode regions 530, 532.

The P type epitaxial layer 520 is formed on the P type substrate 510. The photodiode regions 530, 532 are formed within the P type epitaxial layer 520. The P type well region 540 is formed within the P type epitaxial layer 520 with a first horizontal distance to the photodiode region 530 and a vertical distance to a surface of the P type epitaxial layer 520. The gate region 550 of a source follower transistor is formed on the MOS gate oxide 580 formed on the surface of the P type epitaxial layer 520 and above the P type well region 540, and has a second horizontal distance to the photodiode region 530. The P type implant isolation region 560 is formed within the P type epitaxial layer 520 and between the P type well region 540 and the photodiode region 530, and a width of the P type implant isolation region 560 is equal to the second horizontal distance. The first horizontal distance is longer than the second horizontal distance, and there is a distance between the P type implant isolation region 560 and the P type well region 540 as an anti-blooming path.

For example, there can be a light P-doping region between the P type implant isolation region 560 and the P type well region 540, wherein the light P-doping region has a lower barrier compared to the P type implant isolation region 560 and the P type well region 540. Therefore, an anti-blooming path can be formed in the P type epitaxial layer 520 and between the photodiode region 530 and the gate region 550 of the source follower transistor in the image sensor 500 of the present invention.

Figure 7:
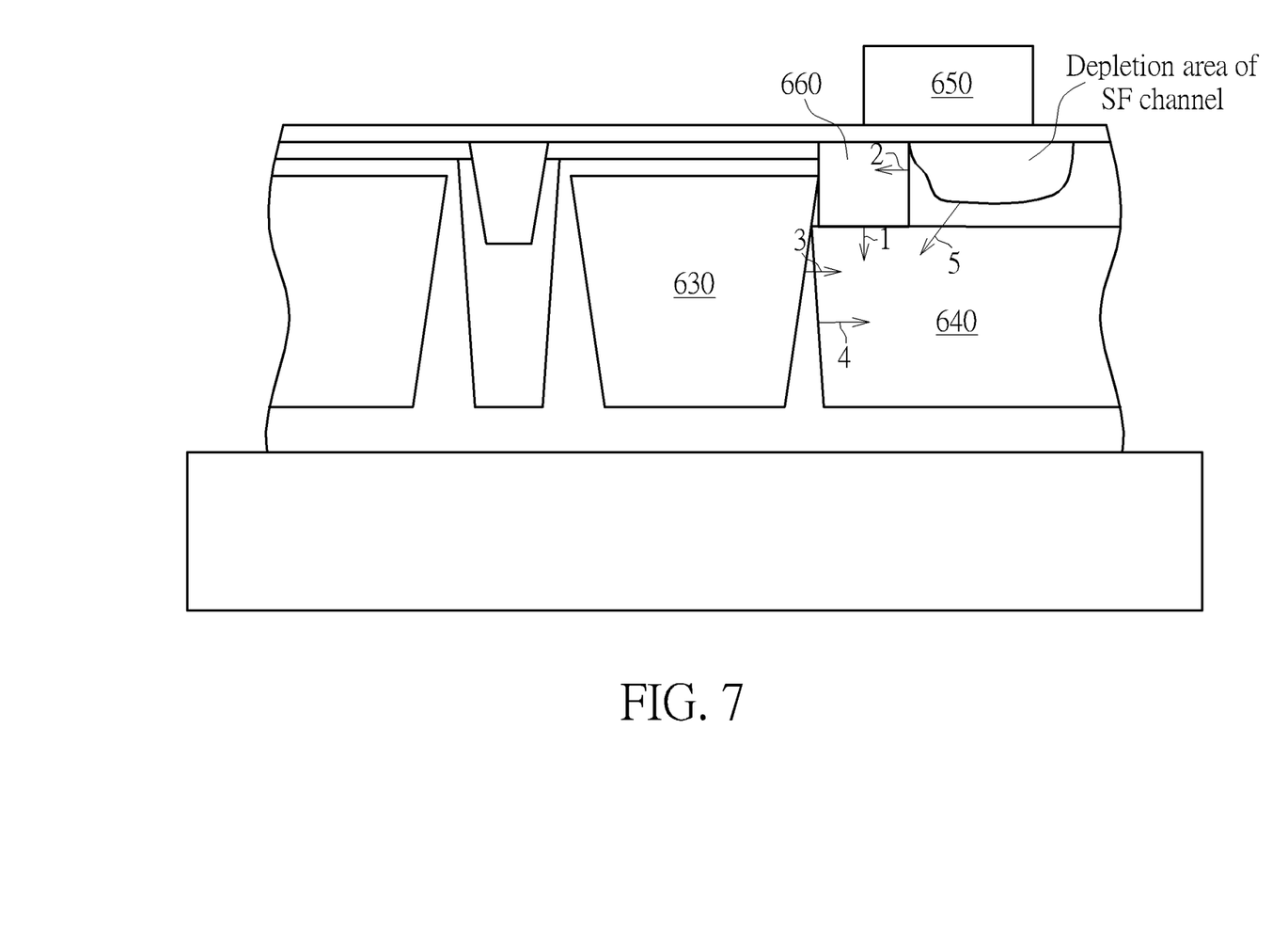
FIG. 7 shows five proposed approaches of creating the anti-blooming path in the P type epitaxial layer and between the photodiode region and the SF gate channel region.

There are five proposed approaches of creating the anti-blooming path in the P type epitaxial layer 520 and between the photodiode region 530 and the gate region 550. The five approaches are illustrated in FIG. 7. As shown in FIG. 7, the edges of the gate region 650, the P type implant isolation region 660, and the P type well region 640 shifted by each approach are labeled correspondingly in the following paragraph.

1. Special anti-blooming implant such as implanting N-doping in the P type implant isolation region 660 or make P type implant isolation region 660 shallower and the P type well region 640 deeper into the Si by implant energy tuning.

2. Adjusting width of the gate region 650 of the source follower transistor. the P type implant isolation region 660 is required to be self-aligned with the gate region 650, and thus edge the P type implant isolation region 660 will be moved according to position of the gate region.

3. Adjusting distance between the photodiode region 630 and the gate region 650 of the source follower transistor.

4. Adjusting width of the P type well region 640 under the gate region 650 of the source follower transistor to create a light P-doping region (i.e. lower barrier) between the P type implant isolation region 660 and the P type well region 640.

5. Biasing a gate voltage of the source follower via Reset transistor of pixel to a positive voltage and adjusting the positive voltage to create a larger extend of depletion edge of the source follower in deep depletion mode.

Because the five proposed approaches above are independent to each other, any combination of the five proposed approaches is also a valid approach to get a collective effect.

Please note that the above embodiment is only for an illustrative purpose and is not meant to be a limitation of the present invention. For example, in another embodiment of the image sensor, the P type substrate can be replaced by a N type substrate; the P type epitaxial layer can be replaced by a N type epitaxial layer; the P type well region can be replaced by a N type well region; and the P type implant isolation region can be replaced by a N type implant isolation region.

Figure 8:
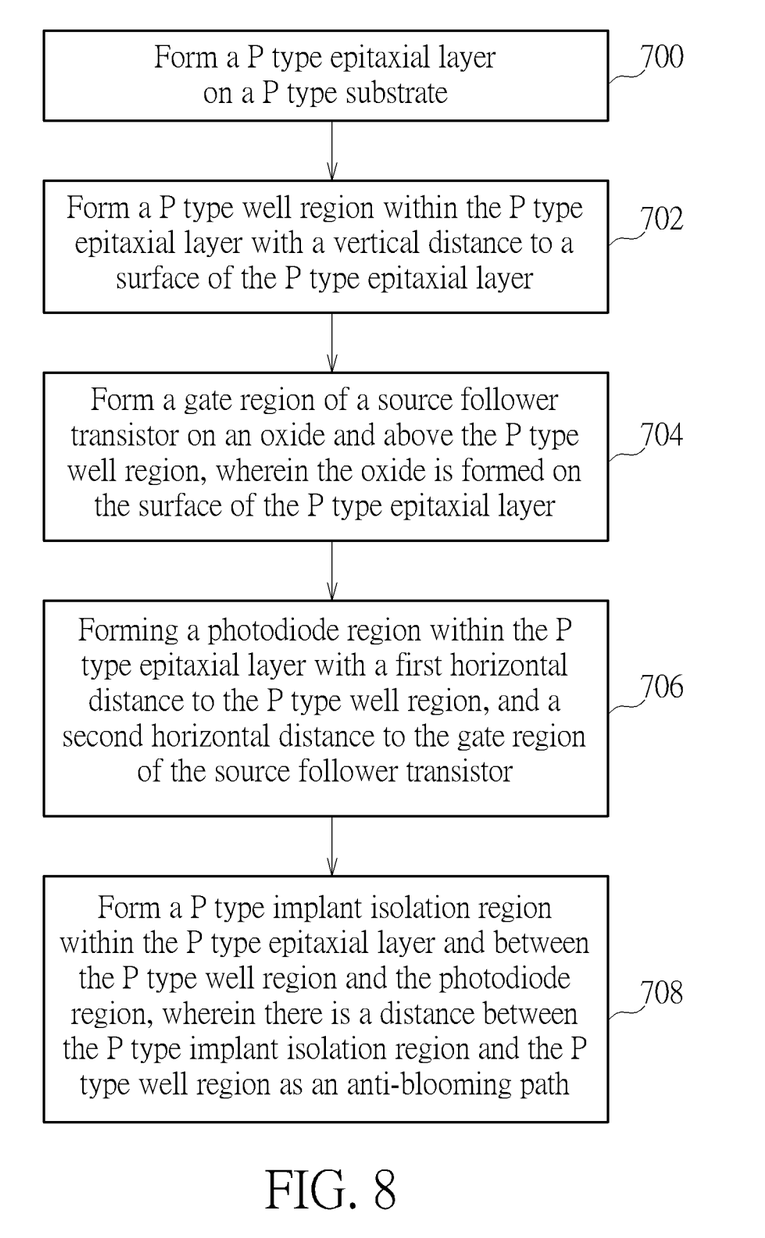
FIG. 8 shows a flowchart of the present invention showing n fabricating method of an image sensor in accordance with an embodiment of the present invention.

Please refer to FIG. 8. FIG. 8 shows a flowchart of the present invention showing fabricating method of an image sensor in accordance with an embodiment of the present invention. Provided that substantially the same result is achieved, the steps of the process flowchart do not have to be in the exact order shown in FIG. 6 and need not be contiguous, meaning that other steps can be intermediate. The fabricating method of the present invention comprises the following steps:

Step 700: Form a P type epitaxial layer on a P type substrate.

Step 702: Form a P type well region within the P type epitaxial layer with a vertical distance to a surface of the P type epitaxial layer.

Step 704: Form a gate region of a source follower transistor on an oxide and above the P type well region, wherein the oxide is formed on the surface of the P type epitaxial layer.

Step 706: Forming a photodiode region within the P type epitaxial layer with a first horizontal distance to the P type well region, and a second horizontal distance to the gate region of the source follower transistor.

Step 708: Form a P type implant isolation region within the P type epitaxial layer and between the P type well region and the photodiode region, wherein there is a distance between the P type implant isolation region and the P type well region as an anti-blooming path.

Please note that the above embodiment is only for an illustrative purpose and is not meant to be a limitation of the present invention. For example, in another embodiment of the fabricating method, the P type substrate can be replaced by a N type substrate; the P type epitaxial layer can be replaced by a N type epitaxial layer; the P type well region can be replaced by a N type well region; and the P type implant isolation region can be replaced by a N type implant isolation region.

Briefly summarized, the image sensor and the fabricating method of the image sensor of the present invention are capable of reducing blooming by forming an anti-blooming path between the source follower transistor channel and the photodiode region and with no STI between the source follower transistor channel and the photodiode region. By proper tuning of anti-blooming path potential barrier, almost all the electron leakage current generated from SF channel depletion region will be absorbed by SF drain terminal. Thus, the present invention can solve the above problem of using the Tx gate as the anti-blooming drain.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor, comprising:
   a first type epitaxial layer, formed on a first type substrate;
   a photodiode region, formed within the first type epitaxial layer;
   a first type well region, formed within the first type epitaxial layer with a first horizontal distance to the photodiode region and a vertical distance to a surface of the first type epitaxial layer;
   a gate region of a source follower transistor, formed on an oxide formed on the surface of the first type epitaxial layer and above the first type well region, having a second horizontal distance to the photodiode region; and
   a first type implant isolation region, formed within the first type epitaxial layer and between the first type well region and the photodiode region;
   wherein the first horizontal distance is longer than the second horizontal distance, and there is a distance between the first type implant isolation region and the first type well region as an anti-blooming path.

2. The image sensor of claim 1, wherein a width of the first type implant isolation region is equal to the second horizontal distance.

3. The image sensor of claim 1, wherein the first type substrate is a P type substrate, the first type epitaxial layer is a P-epitaxial (P-epi) layer, the first type well is a P-well, and the first type implant isolation is a P type implant isolation (P-iso).

4. The image sensor of claim 1, wherein the first type substrate is an N type substrate, the first type epitaxial layer is an N-epitaxial (N-epi) layer, the first type well is an N-well, and the first type implant isolation is an N type implant isolation (N-iso).

5. A fabricating method of an image sensor, comprising:
   forming a first type epitaxial layer on a first type substrate;
   forming a first type well region within the first type epitaxial layer with a vertical distance to a surface of the first type epitaxial layer;
   forming a gate region of a source follower transistor on an oxide formed on the surface of the first type epitaxial layer and above the first type well region;
   forming a photodiode region within the first type epitaxial layer with a first horizontal distance to the first type well region, and a second horizontal distance to the gate region of the source follower transistor; and
   forming a first type implant isolation region within the first type epitaxial layer and between the first type well region and the photodiode region;
   wherein the first horizontal distance is longer than the second horizontal distance, and there is a distance between the first type implant isolation region and the first type well region as an anti-blooming path.

6. The fabricating method of claim 5, wherein a width of the first type implant isolation region is equal to the second horizontal distance.

7. The fabricating method of claim 5, wherein the first type substrate is a P type substrate, the first type epitaxial layer is a P-epitaxial (P-epi) layer, the first type well is a P-well, and the first type implant isolation is a P type implant isolation (P-iso).

8. The fabricating method of claim 5, wherein the first type substrate is an N type substrate, the first type epitaxial layer is an N-epitaxial (N-epi) layer, the first type well is an N-well, and the first type implant isolation is an N type implant isolation (N-iso).

* * * * *